(12) United States Patent
Tanguy et al.

(10) Patent No.: US 11,179,883 B2
(45) Date of Patent: Nov. 23, 2021

(54) METHOD FOR PRODUCING A 3D STRUCTURE BY MEANS OF LASER LITHOGRAPHY, AND CORRESPONDING COMPUTER PROGRAM PRODUCT

(71) Applicant: Nanoscribe Holding GmbH, Eggenstein-Leopoldshafen (DE)

(72) Inventors: Yann Tanguy, Lauterbourg (FR); Nicole Lindenmann, Niefern-Oeschelbronn (DE)

(73) Assignee: Nanoscribe Holding GmbH, Eggenstein-Leopoldshafen (DE)

( * ) Notice: Subject to any disclaimer, the term of this patent is extended or adjusted under 35 U.S.C. 154(b) by 116 days.

(21) Appl. No.: 16/604,286

(22) PCT Filed: Feb. 7, 2018

(86) PCT No.: PCT/EP2018/053016
§ 371 (c)(1),
(2) Date: Oct. 10, 2019

(87) PCT Pub. No.: WO2018/206161
PCT Pub. Date: Nov. 15, 2018

(65) Prior Publication Data
US 2020/0047408 A1   Feb. 13, 2020

(30) Foreign Application Priority Data

May 11, 2017   (DE) ..................... 10 2017 110 241.8

(51) Int. Cl.
*B29C 64/135*   (2017.01)
*B33Y 10/00*    (2015.01)
(Continued)

(52) U.S. Cl.
CPC .......... *B29C 64/135* (2017.08); *B29C 64/386* (2017.08); *B33Y 10/00* (2014.12);
(Continued)

(58) Field of Classification Search
CPC .................................................. B29C 64/135
See application file for complete search history.

(56) References Cited

U.S. PATENT DOCUMENTS

| | | |
|---|---|---|
| 6,730,256 B1 | 5/2004 | Bloomstein et al. |
| 2015/0183165 A1 | 7/2015 | Abe et al. |

(Continued)

FOREIGN PATENT DOCUMENTS

| | | |
|---|---|---|
| CN | 101918199 A | 12/2010 |
| CN | 106061717 A | 10/2016 |

(Continued)

*Primary Examiner* — Larry W Thrower
(74) *Attorney, Agent, or Firm* — Aslan Law, P.C.

(57) ABSTRACT

A system, computer program product and method for producing a three-dimensional overall structure by means of laser lithography, the overall structure being approximated by at least one partial structure, wherein, for the purposes of writing the partial structure, an exposure dose is radiated into the lithography material in a focal region of a laser writing beam while exploiting multi-photon absorption. Here, in the partial structure, the exposure dose in those edge portions that immediately adjoin an external surface of the overall structure to be produced is modified in comparison with the remaining partial structure.

20 Claims, 5 Drawing Sheets

(51) Int. Cl.
*B33Y 50/00* (2015.01)
*B29C 64/386* (2017.01)
*G03F 7/20* (2006.01)

(52) U.S. Cl.
CPC .............. *B33Y 50/00* (2014.12); *G03F 7/704* (2013.01); *G03F 7/705* (2013.01)

(56) References Cited

U.S. PATENT DOCUMENTS

| | | |
|---|---|---|
| 2016/0046070 A1 | 2/2016 | Mappes et al. |
| 2017/0066052 A1 | 3/2017 | Abe et al. |

FOREIGN PATENT DOCUMENTS

| | | |
|---|---|---|
| DE | 102 45 617 A1 | 4/2004 |
| DE | 10 2005 027 311 B3 | 11/2006 |
| DE | 10 2011 105 045 B3 | 6/2012 |
| DE | 10 2011 012 412 A1 | 8/2012 |
| EP | 0 606 839 A1 | 7/1994 |
| EP | 3 093 123 A1 | 11/2016 |
| JP | 2005-084617 | 3/2005 |
| JP | 2014-111385 A | 6/2014 |
| JP | 2015 124395 A | 7/2015 |

METHOD FOR PRODUCING A 3D STRUCTURE BY MEANS OF LASER LITHOGRAPHY, AND CORRESPONDING COMPUTER PROGRAM PRODUCT

CROSS-REFERENCE TO RELATED APPLICATIONS

This application claims priority to DE Patent Application No. 10 2017 110 241.8 filed on May 11, 2017, and to PCT Application No. PCT/EP2018/053016 filed on Feb. 7, 2018, the entire contents of which are hereby incorporated by reference.

DESCRIPTION

The invention relates to a method for producing a three-dimensional overall structure by means of laser lithography according to the preamble of claim 1 and to a computer program product adapted therefor according to claim 15.

Such methods find particular use in the production of micro- or nanostructures in areas in which both high precision and freedom of design are desired for the structure to be produced. In the field of laser lithography, in particular for so-called direct laser writing, it is known that the desired overall structure is produced by sequentially writing a series of partial structures which complement each other in total to the desired structure. Usually, the overall structure is written in layers or slices.

The individual partial structures are usually determined mathematically from the known overall structure. For this purpose, it is known to computationally record the overall structure in a grid structure and to divide it into the partial structures. The problem arises that the partial structures are again determined in the grid structure and thus do not exactly reproduce the exact course of the overall structure. In addition, the laser lithography inherently has a certain resolution limit, in particular, given by the spatial extent of the focus region. As a result, in the structures composed of different partial structures, step-like surface courses can occur. This so-called "step" effect makes it problematic to produce overall structures with continuous surface progressions. Another problem is that so-called "bulging" effects can occur when producing very densely packed structures. In this case, certain structural areas can be undesirably enlarged or inflated, which is due to an effectively excessive energy input into the lithography material when structural details are written in immediate proximity one after the other. Overall, in the known laser lithography method, it can come to undesirable deviation between the structure to be written and the structure actually resulting from the composite partial structures.

In the prior art, various methods are known to deal with the problems and inaccuracies mentioned. In particular, an increased accuracy can be achieved by breaking it down into smaller partial structures. However, since this also increases the number of partial structures to be generated, this procedure is time-consuming. It is also conceivable to make a finer screening of the entire structure only in areas with strong contour changes. This increases the computational effort when generating the partial structures and is therefore also time-consuming.

Stereolithography methods are known from U.S. Pat. Nos. 4,575,330 A1 or 5,247,180 A, wherein a desired structure of partial structures is built up block-like or in layers in a bath of liquid lithography material by local exposure with a writing beam. In this case, the writing beam cures structural regions by local exposure in each case in a layer directly on the surface of a bath of the lithography material. By stepwise lowering of a carrier substrate in the bath of lithography material, the structure is then built up in layers. A direct construction of the desired structure in a volume of the lithography material is not possible with this method.

The object of the invention is to compensate undesired inaccuracies in the laser lithography method mentioned above and to provide greater freedom of design with regard to the structures to be produced. In addition, the aim is to shorten the process times as much as possible.

This object is achieved by a method according to claim 1. This is a laser lithography method, in particular so-called direct laser writing, by means of a laser lithography apparatus in a volume of lithography material or in a volume filled with lithography material. The overall structure is written in the lithography material by defining at least one partial structure (i.e., by "writing" into the lithography material with the laser lithography apparatus), wherein the at least one partial structure at least approximates the desired overall structure.

In order to write the partial structure, an exposure dose is irradiated into the lithography material in a spatially resolved manner in a focal region of a laser writing beam, utilizing two-photon absorption or, in general, multi-photon absorption. As a result, the lithography material is locally modified and structured in this way. The final definition of the structure may be followed by development steps, for example, to trigger the areas of the lithography material that do not contribute to the overall structure or to cure the overall structure.

In order to achieve the object, it is proposed, in particular, that the exposure dose be changed in comparison to other regions of the partial structure, in the at least one partial structure in those edge portions which adjoin directly to an external surface of the overall structure to be produced (and insofar are delimited by the external surface itself).

To generate the partial structure, the focus region of the laser writing beam is shifted through the lithography material, thereby introducing the exposure dose. In order to shift the focus range, the laser writing beam can be deflected in a controlled manner, for example, by means of a beam guiding device. However, it is also conceivable that the lithography material or a substrate with the lithography material is shifted in a controlled manner relative to the laser writing beam by means of a positioning device. Both concepts can also be used together for shifting. The exposure dose is in particular a volume dose of radiant energy. When the focus region is shifted to the respective edge portion, the exposure dose is changed according to the invention.

The introduction of the exposure dose by means of multi-photon absorption is particularly advantageous in the 3D laser writing of the presently used type. For this purpose, the lithography material is preferably designed in such a way and the laser writing beam tuned to the lithography material such that a change of the lithography material (for example local polymerization) is possible only by absorption of a plurality of photons. For this purpose, for example, the wavelength of the laser writing beam can be selected (and thus the quantum energy assigned can be dimensioned) such that the energy input required for the change of the lithography material is only achieved by simultaneous absorption of two or more quanta. The probability of such a process is intensity-dependent and significantly increased in the focus region compared to the rest of the writing beam. Fundamental considerations suggest that the probability of absorbing two or more quanta may depend on the square or a higher power of the radiation intensity. In contrast, the probability of linear absorption processes has a different intensity dependence, in particular with a lower power of the radiation intensity. Since attenuation occurs as the laser writing beam penetrates into the lithography material (for example, according to Beer's Law), writing in the focus region using linear absorption processes deep under the liquid surface of the lithography material would be problematic, since the highest absorption probability is not necessarily present even when focusing below the surface in the focus region due to the attenuation itself. By contrast, the mechanism of multi-photon absorption makes it possible to introduce the desired exposure dose into the interior of a volume of lithography material and to locally modify the lithography material. Apparatuses for stepwise lowering of a support structure in a bath of lithography material, as known in the art, is thus not required.

By irradiating the exposure dose, the lithography material is locally chemically and/or physically changed, for example, cured or polymerized. The size of the changed area or "voxels" in the lithography material depends on the exposure dose. By varying the exposure dose, the spatial extent of the respective structural area or "voxels" can thus be changed. By suitable dimensioning of the change in the exposure dose, the written areas can thus be adjusted in size such that missing regions between the desired overall structure and the partial structures are compensated.

This makes it possible to compensate for the inaccuracies described at the outset, which can occur when the overall structure approaches one or more partial structures. Other problems typically encountered in laser lithography can also be eliminated by the above procedure. For example, undesirable shrinkage effects may occur when using negative resists. Negative resists are cured in the area exposed to radiant energy. The shrinkage effects are caused, for example, by the fact that the lithography material occupies less space in the cured state, than in the original (for example, viscous) state. This can be compensated for by targeted variation of the exposure dose.

However, the variation of the exposure dose also makes it possible to directly generate a desired surface structure in a targeted manner. In this case, the exposure dose in the edge portions, which later provide the surface of the overall structure, is varied according to a defined pattern. This leads to the fact that the voxels written in the edge portions have different expansions and thus contribute to the desired surface structuring.

Preferably, the exposure dose is changed only in the edge portions. In the other and, in particular, in the inner regions of the partial structures, preferably no variation of the exposure dose occurs. Thereby, the arithmetic operations necessary for the control of the laser lithography apparatus can be simplified.

The method described makes it possible to approximate the overall structure with a comparatively coarse screening through the partial structures. At the same time, short process times can be achieved.

In the present context, the term "lithography material" basically refers to substances whose chemical and/or physical material properties can be changed by irradiation with a laser writing beam, for example, which are known as lithography resists. Depending on the nature of the changes induced by the writing beam, lithography materials can be formed in so-called negative resists (where irradiation causes local hardening or solubility in a developing medium) and in so-called positive resists (where irradiation locally increases the solubility in a developing medium).

According to an advantageous embodiment, the overall structure is defined by defining a plurality of partial structures one after the other, the partial structures together approximating the overall structure. In this case, a provision is made in particular for the exposure dose to be changed as described only in those partial structures which adjoin an external surface of the overall structure to be generated. In this case, in the respective partial structures, the exposure dose is again changed in comparison to the rest of the partial structure in those edge portions which directly adjoin the external surface. Depending on the desired overall structure, a partial structure can also be designed completely as an edge portion, i.e. completely adjoining the external surface.

The partial structures are, for example, layered, so that the overall structure is approximated by a plurality of partial structures which are adjacent to one another in a layered manner (quasi superposed one another). In principle, however, the partial structures can also have a different shape. For example, the entire structure can be divided into several, line-like adjacent areas, or into so-called voxels. Even complex shapes for the partial structures can be advantageous.

The change of the exposure dose in the edge portion can basically be done in various ways.

It is conceivable that the exposure dose is increased in the edge portion in comparison to the rest of the partial structure. This procedure makes it possible to compensate for the "step effect" described above. In this respect, by increasing the exposure dose, the marginal space regions effectively obtain a larger volume and can fill out the unwanted steps or missing regions due to the grid-like approximation of the overall structure. In this way, it is also possible to approximate overall structures with continuously extending and curved or arched surfaces.

However, it is also conceivable that the exposure dose is reduced in the edge portion in comparison to the rest of the partial structure. With this procedure, for example, overexposure effects can be counteracted, which can occur in small written structures which were quickly successively written. In particular, the so-called "bulging effect" can be counteracted, which leads to an unwanted expansion of the written area due to thermal accumulation in closely adjacent and quickly successively written partial structures.

The exposure dose can be changed locally, for example, by changing a radiation power of the laser writing beam. Accordingly, the intensity of the laser writing beam can be changed, for example by means of an acousto-optic modulator.

In another aspect, the writing of the partial structure is accomplished by scanning the focus region through the lithography material. The exposure dose can then be changed by varying a speed of the shift of the focus region accordingly. As a result, the dwell time of the focus region in a certain area of space is effectively changed and thus the irradiated exposure dose (on spatial and temporal average) is varied.

By way of example, the writing of the partial structure takes place such that the focal region is shifted along a scan curve through the lithography material, the scan curve having a plurality of immediately adjacent curve segments.

In order to vary the effective exposure dose, it is then possible to wait for a waiting time during which no exposure dose is irradiated between passing through two consecutively traversed and immediately adjacent curve portions. In particular, the laser writing beam is disabled during the waiting time. In the area in which the curve portions run adjacent to one another, the effective exposure dose depends on how long the waiting time is. Thus, the effective (in particular temporally averaged) exposure dose can be changed in an edge portion by applying in the edge portions an extended or shortened waiting time between the curves in comparison to the rest of the internal structure.

The exposure dose can also be effectively changed by the process that immediately adjacent curve portions in the edge portion have a different average distance from one another than in the other portions of the respective partial structure. If the curve portions are closer to each other on average, an increased exposure dose is effectively introduced on the spatial and temporal average. If the curve portions are spaced further apart on average, the effective exposure dose is reduced.

When writing the partial structure, the exposure dose can also be varied effectively such that the focus region passes through a scan curve through the lithography material and in that the scan curve is traversed at least twice or more times within the edge portion.

Overall, thus, the exposure dose can be changed on the one hand by controlling the radiation output of the laser writing beam, on the other hand by changing the exposure pattern.

The laser writing beam can basically be designed as a continuous wave laser or as a pulsed laser. A pulsed laser is characterized in particular by an intrinsic pulse rate (e.g. MHz range) and an intrinsic pulse length (e.g. femtosecond range). In order to change the effective exposure dose (on average over time), the laser writing beam can additionally be modulated in time, for example by means of an acousto-optical modulator, and thus modulated pulses can be generated. The modulated pulses again have a modulated pulse length and a modulated pulse rate. As explained above, the pulsed laser writing beam or the continuous wave laser can be shifted along a scan curve through the lithography material.

To determine the partial structures, the overall structure is preferably screened by computation, in particular decomposed in volume elements or "voxels" and the partial structures are each formed by a preferably contiguous set of voxels. In this respect, the partial structure is composed of a set of shape-like or shape-identical volume elements (voxels).

For example, the laser writing beam is formed as a train of modulated laser pulses having a modulated pulse rate and a modulated pulse length. It can be provided that a modulated laser pulse is used in each case for writing a volume element. However, a volume element can also be defined by a plurality of modulated pulses. The effective (in particular temporally averaged) exposure dose can be changed, for example, by varying the modulated pulse rate and/or the modulated pulse length. Here, the modulated pulse rate denotes in particular the number of modulated pulses per time unit, and the modulated pulse length denotes in particular the duration of the irradiation per pulse. The pulses of the laser writing beam can be effected, for example, by temporally modulating the intensity of the laser, for example by means of an acousto-optical modulator. As explained above, the pulsed laser writing beam can be shifted along a scan curve through the lithography material.

In principle, the breakdown of the overall structure into the partial structure or the multiple partial structures is preferably carried out by software engineering and computer. In this respect, a data set representing the overall structure (for example CAD data) is provided and, if appropriate, stored on a data carrier or in a volatile memory device. From this, further data sets are determined by computer. In particular, a further data set is determined which represents the partial structure or the plurality of partial structures. Preferably, software is used to perform a non-overlapping decomposition of the overall structure into the partial structures. However, it may also be advantageous to provide an overlap region between different partial structures. In the overlap region, a smooth transition can be achieved in the manner described by varying the exposure dose. Overall, a data set representing the overall structure is provided in a computing device with processor and memory and is stored in a memory. From this, further data records are determined by means of the computing device and are also stored in the memory. Preferably, when determining the further data set, a grid accuracy is used, with which the overall structure is approximated. As explained, steps and/or missing regions can occur during the decomposition with the aforesaid grid accuracy. This can lead to problems explained at the outset if the overall structure has a continuous surface course with curvatures and arches.

In order to solve this problem, it is proposed, in particular, that an even further data record from said data sets is determined and possibly stored (by means of the computing device). This further data record represents deviations of the partial structure or of the entirety of several partial structures from the overall structure. This makes it possible to determine the change in the exposure dose as a function of the local deviations in the edge portions. If, for example, a step occurs in the edge portion due to the screening, which does not exist in the actual overall structure, this will lead to an abruptly increased deviation. The exposure dose may then be increased in this range to complete the step.

The laser lithography apparatus which is typically used comprises optical systems (beam guiding means, focusing means, lenses, etc.). Such optical systems may be subject to imaging errors, e.g. field curvature, aberration or astigmatism. The imaging errors can also cause undesirable deviations between the desired overall structure and the actual structure approximated by the at least one partial structure. With the described method, the deviations can be corrected. For example, the imaging errors can be determined location-dependent by calibration measurements and stored in the form of a characteristic data set. The change in the exposure dose can then be determined depending on the characteristic data set in a location-dependent manner in order to minimize the deviation.

The function by which the exposure dose is determined from the deviation may have different characteristics. For example, the use of a monotonically increasing function can be considered. As explained, unwanted missing regions can thereby be filled. However, it may also be advantageous to use a locally monotonically decreasing function, for example to compensate for overexposure effects. Even more complex functions can be advantageous.

Another approach to changing the exposure dose is to first provide a dataset representing the external surface of the overall structure and to store it in the memory, the calculator determining local slopes and/or curvatures of the external surface. The change in the exposure dose then preferably takes place as a function of the local slope and/or curvature of that area of the external surface which adjoins the respective edge portion. In other words, the exposure dose is varied, in particular, where, due to curvatures, slopes or changes in curvature of the surface of the overall structure, the approach through the at least one partial structure has a large deviation from the desired overall structure. Again, in principle monotonically decreasing or monotonically increasing functions can be used to reflect the dependence of the exposure dose of the slope and/or curvature.

As explained, the invention is preferably implemented by a computer. In this respect, a control apparatus for a laser lithography apparatus preferably comprises a computer, on which a computer program is executable, which performs a control function for the laser lithography apparatus according to the method described above.

The object mentioned in the introduction is thus also achieved by a computer program product according to claim 15. In addition, the object is achieved by a data carrier on which the corresponding computer program is stored and/or by a data stream (for example, downloadable from the Internet), which represents the corresponding computer program.

The invention will be explained in more detail in the following with reference to the drawings.

In the drawings and in the following description, the same reference signs are used in each case for identical or corresponding features.

Figure 1:
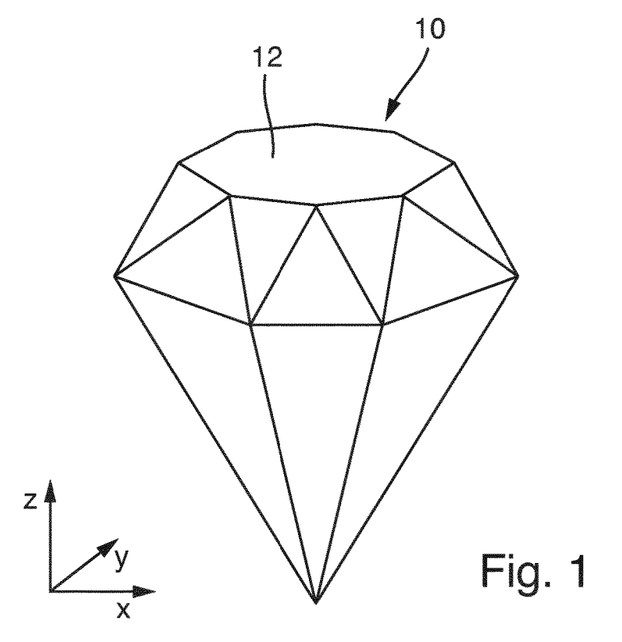
FIG. 1 shows a sketched example of an overall structure with a formed complex external surface, wherein said structure is to be produced laser-lithographically.

FIG. 1 shows an overall structure which is to be written by means of 3D laser lithography in a volume of lithography material. Such structures typically have structural features with measurements in the micrometer or nanometer range. The dimensions of the overall structure may be, for example, in the micrometer range, millimeter range or centimeter range.

The overall structure is designated by the reference numeral 10 and has an external surface 12, which has a course with different slopes and possibly also curves. These areas can, as explained above, be problematic in writing. The illustrated form is only an example. The advantages described herein can also be achieved in particular with shapes with curvatures and curves.

For lithographic production, the overall structure 10 or a data record representing this structure is decomposed into, for example, a multiplicity of partial structures 14 or corresponding data sets. This is usually computerized.

Figure 2:
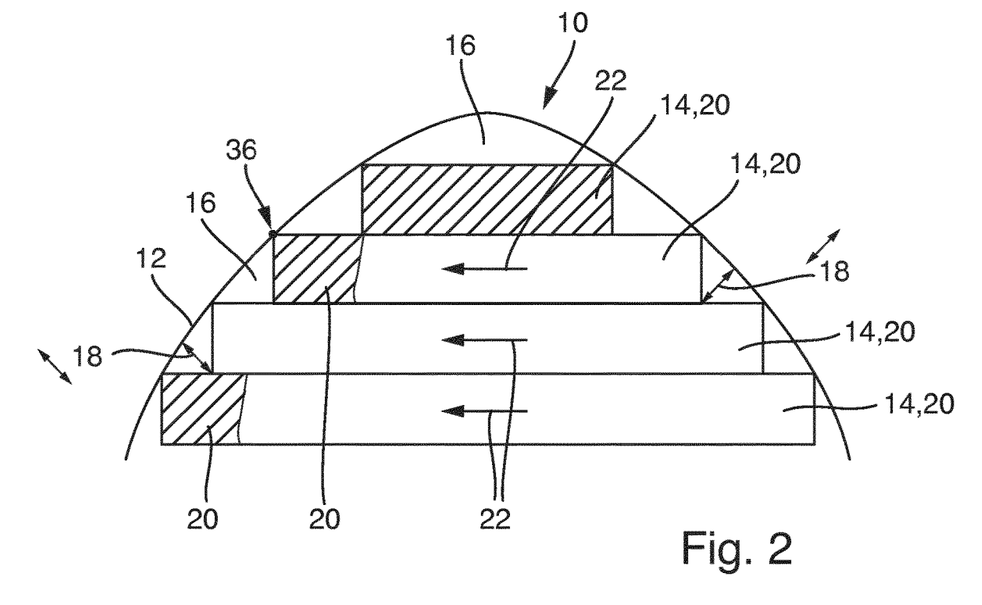
FIG. 2 shows a sketch of a curved region of an exemplary external surface and approximate partial structures.

FIG. 2 shows how the composite partial structures 14 approximate the desired overall structure 10. For this purpose, only a section of an overall structure 10 is shown in FIG. 2. The illustrated decomposition into layered partial structures 14 is exemplary. In principle, the partial structures 14 can be chosen freely.

Since, for practical reasons, the decomposition into partial structures 14 usually takes place with a certain degree of screening, there are missing regions 16 between the desired external surface 12 of the overall structure 10 and the quantity of assembled partial structures 14, in which the external surface 12 has a deviation 18 from the partial structures 14. As a matter of principle, these deviations 18 occur only in edge portions 20 of the partial structures 14, since these edge portions 20 adjoin the desired external surface 12 of the overall structure 10 to be achieved. In particular, the partial structure 14 arranged at the top in FIG. 2 can be regarded as a whole as an edge portion 20, since this partial structure 14 completely adjoins the external surface 12.

Figure 3:
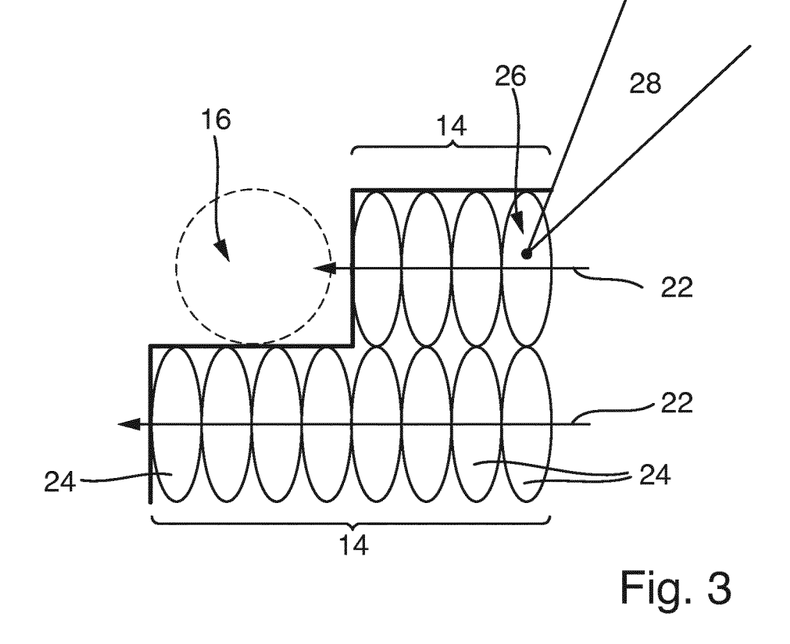
FIG. 3 shows a sketch to explain unwanted step formation.

As sketched in FIG. 3, the writing of the partial structures takes place such that a focal region 26 of a laser writing beam 28 of a corresponding laser lithography apparatus (not shown) is guided through the volume of lithography material (surrounding the overall structure). In the focus region 26, an exposure dose is introduced into the lithography material.

In one possible embodiment of the method, the partial structures 14 in the lithography material are written by the focus region 26 passing through a scanning curve 22 through the respective partial structures 14 (in FIGS. 2 and 3, the scan curve 22 is sketched in portions).

For example, the partial structures 14 can be written by the focus region passing through the scan curve 22 and emitting a sequence of laser pulses having a defined pulse rate and pulse length. As a result, along the scan curve 22, a series of voxels 24 or volume elements 24 is defined, which form the partial structure 14. The voxels 24 are similar in shape or identical in shape. As explained above, the size of the written voxel 24 is related to the exposure dose introduced into the lithography material.

If the individual partial structures 14 are written in the spatial average with locally the same exposure dose, the result is the image sketched in FIG. 3. In particular, the individual voxels 24 would then be the same size. As a result, this would lead to the inaccuracies explained in FIG. 2 (missing regions 16, deviations 18).

To counteract this, according to the present method, the exposure dose in the edge portions 20 of the partial structures 14 is varied so that it deviates from the exposure dose in the inner regions of the partial structures 14.

Figure 4:
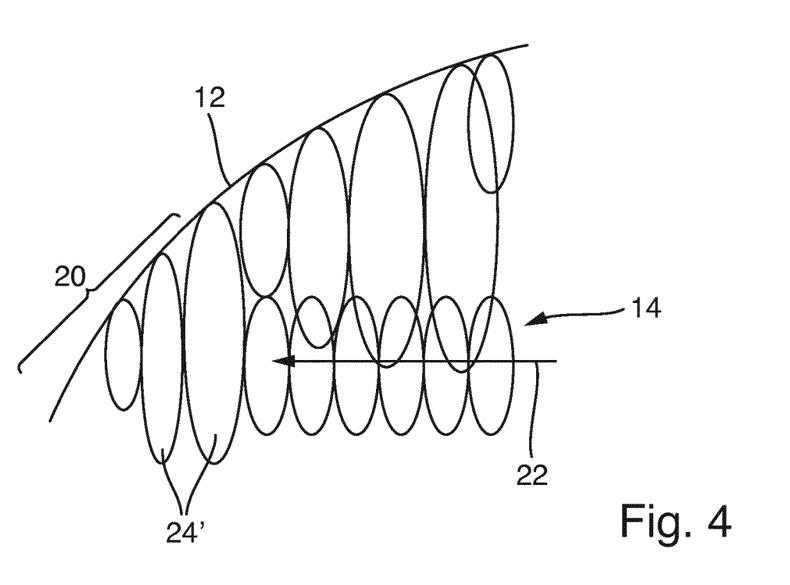
FIG. 4 shows a sketch for explaining the change in the exposure dose in edge portions.

In the example of FIG. 4, the exposure dose is increased in voxels 24' (or volume elements 24') of the partial structure 14 which lie within an edge portion 20 of the partial structure 14. As a result, the voxels 24' have a greater spatial extent. As a result, the missing areas 16 or deviations 18 can be reduced and the surface 12 can be better approximated.

Figure 5:
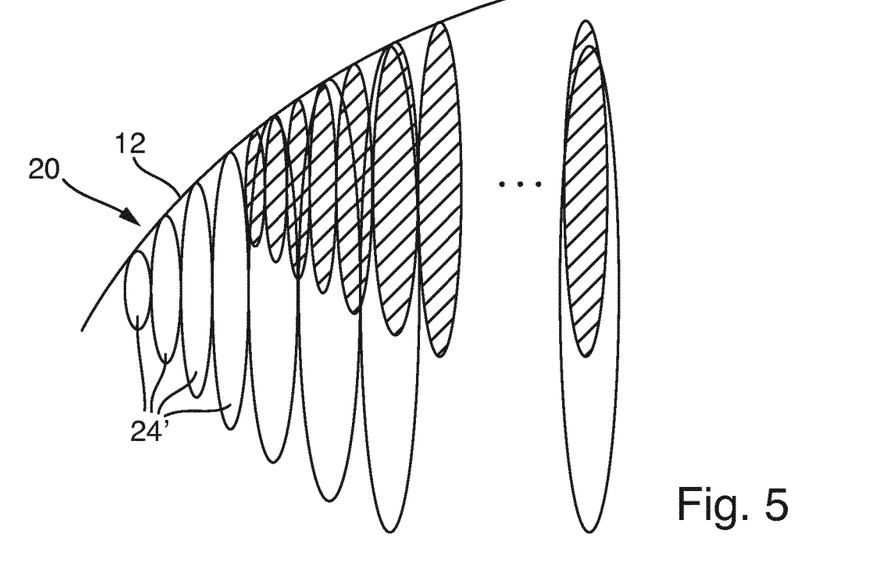
FIG. 5 shows a sketch for explaining an alternative procedure for changing the exposure dose in the edge portions.

Depending on the course of the external surface 12, a better approximation by the partial structures 14 can also be achieved by reducing the exposure dose in the edge portions 20 (see FIG. 5).

Figure 6:
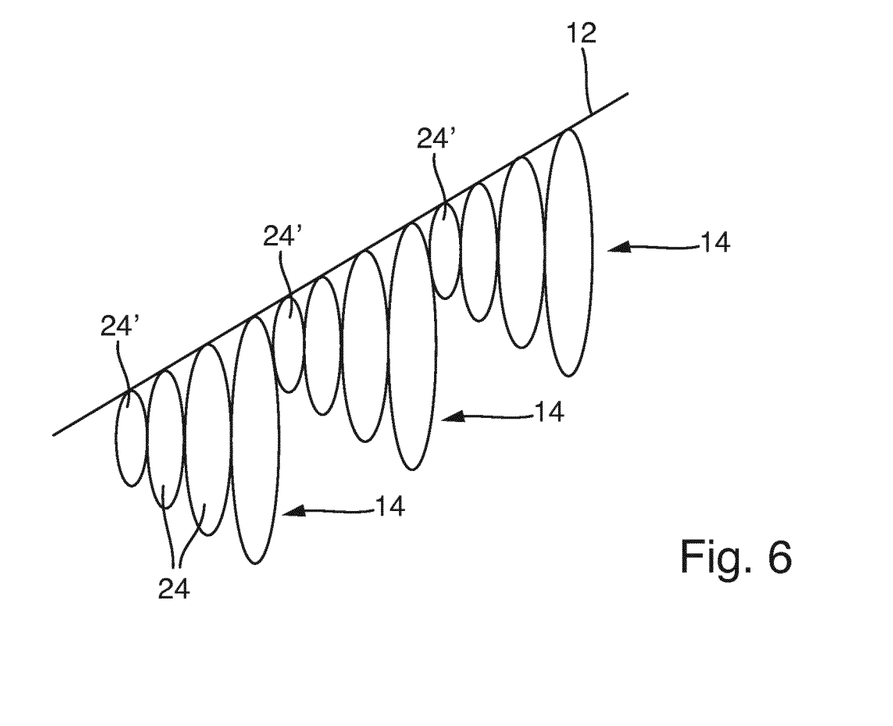
FIG. 6 shows a sketch to explain the change in the exposure dose.

FIG. 6 shows an example that by steadily reducing the exposure dose in the partial structures 14 as it approaches the external surface 12, an inclined plane can be approximated with high accuracy. The plane 12 extends in particular inclined to the extension direction of the partial structures 14.

However, the general idea of the method according to the invention is not limited to the fact that the exposure dose in the edge portions 20 can either only be reduced or only be increased. Basically, a general aspect of the invention is that the exposure dose in the edge portions 20 adjacent or defining the external surface 12 is locally changed according to a defined pattern to produce a desired pattern or reproduce it as well as possible (if the partial structures are composed in total).

Figure 7:
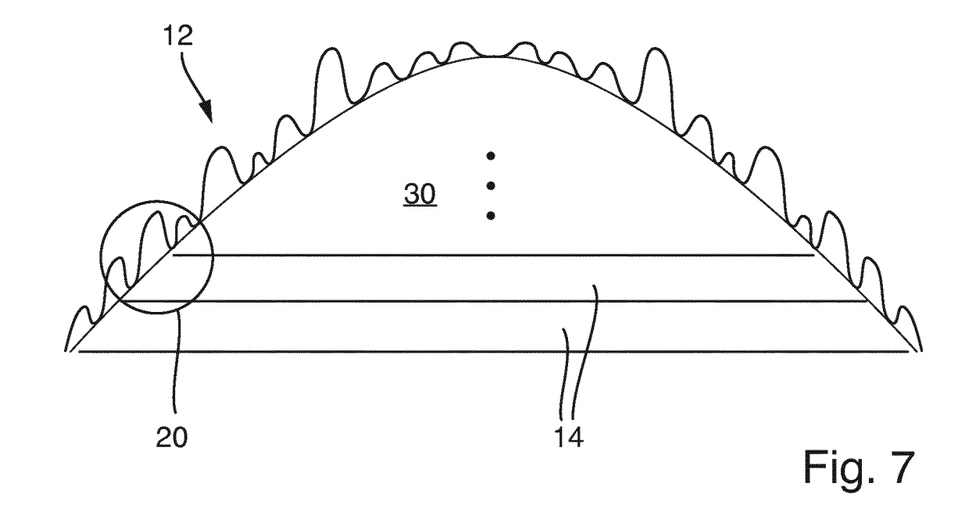
FIG. 7 shows a sketch of a structure to be produced with a structured external surface.

In this respect, an advantageous field of application of the invention is also to generate a desired overall structure on the external surface by the variation of the exposure dose in the edge portions 20 of the respective partial structures 14. This is sketched by way of example in FIG. 7, which illustrates a lens body 30 to be written in a lithography material. The external surface 12 of the lens body 30 has a complex structuring. As discussed, the lens body 30 is preferably written by writing sequentially a plurality of partial structures 14 that approximate the lens body 30. To achieve the contoured external surfaces 12, the exposure dose is locally varied as needed in the edge portions 20 of the partial structures 14. For example, bulges on the external surface 12 can be achieved by introducing an increased exposure dose in marginal areas and therefore generating an enlarged described volume of space in the lithography material.

Figure 8:
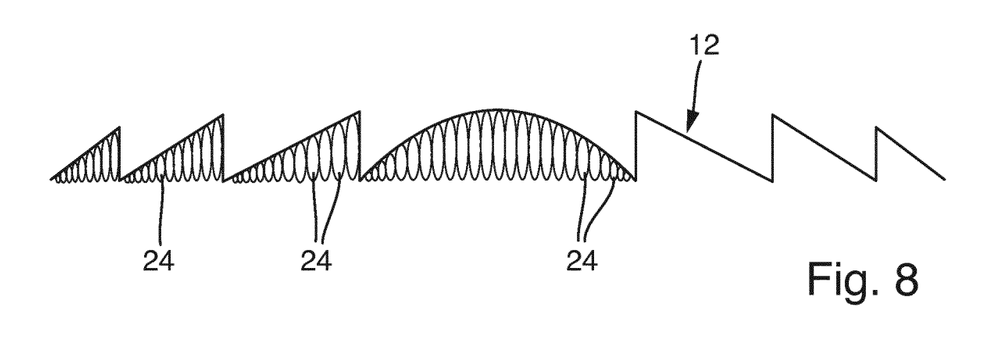
FIG. 8 shows a sketch for explaining a structure produced by exposure variation of the exposure dose.

For example, FIG. 8 illustrates the fabrication of a structure whose external surface 12 represents the contour of a fresnel zone plate or fresnel lens. The exposure dose for generating the individual voxels or volume elements 24 is selectively varied in such a way that the external surface 12 is approximated as precisely as possible.

Figure 9:
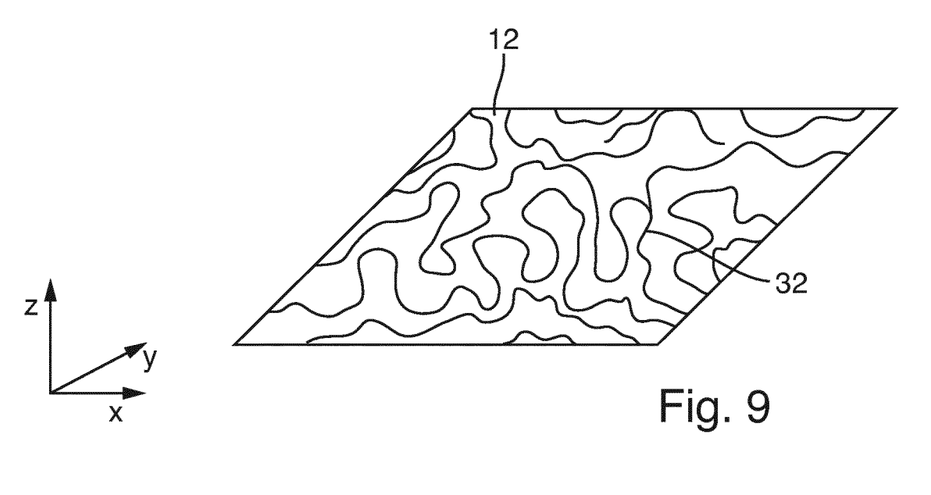
FIG. 9 shows another example of application of the exposure variation in a perspective plan view.
Figure 10:
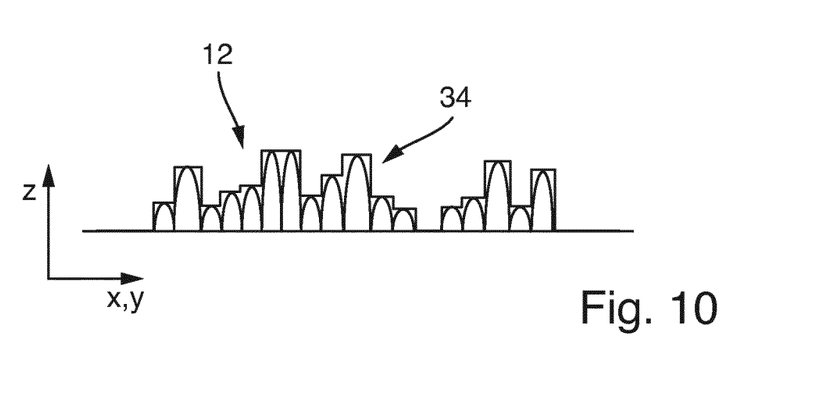
FIG. 10 shows a section through the structure according to FIG. 9.

Another application example is outlined in FIGS. 9 and 10. In this case, the external surface 12 has structural regions 32 (see FIG. 9), in which the external surface 12 has a pronounced height profile 34. Such structures can be used, for example, for calibration in microscopy and in particular for atomic force microscopes.

The variation of the exposure dose in the edge portions 20 takes place, in particular, depending on a function whose input variables are determined from the course of the external surface of the overall structure 10 and possibly from the decomposition result of the overall structure within the framework of screening through partial structures 14. In FIG. 2, for example, one of the partial structures 14 has a region 36 which directly adjoins the actual external surface 12. It is conceivable that the slope and/or curvature of the external surface 12 is computationally determined in the region 36. The change in the exposure dose in the edge portion 20 of the respective partial structure 14 can then take place as a function of the slope and/or curvature locally present in the region 36. As a result, missing areas 16 or deviations 18 can be compensated, which occur especially in those areas in which the external surface 12 has a pronounced slope and/or curvature. It is also conceivable that the deviations 18 resulting from the screening are calculated. These deviations 18 represent differences between the desired surface, which is formed by the external surface 12, and the actual surface, which is defined by partial structures 14 in the edge portions 20. The changes in the exposure dose can then take place as a function of the deviations 18, as described in detail above.

The invention claimed is:

1. A method for producing a three-dimensional overall structure by means of laser lithography in a lithography material, said method comprising:
defining the three-dimensional overall structure in that at least one partial structure is defined, such that said at least one partial structure approximates the three-dimensional overall structure;
radiating, for purposes of writing the at least one partial structure, an exposure dose into the lithography material in a focal region of a laser writing beam while exploiting multi-photon absorption;
changing the exposure dose in comparison to a remaining partial structure in the at least one partial structure in edge portions, which directly adjoin an external surface of the three-dimensional overall structure to be produced;
providing a data set representing the three-dimensional overall structure;
generating, from said data set, at least one further data set, wherein said at least one further data set represents the at least one partial structure;
determining a second further data set is determined, wherein said second further data set represents deviations of the at least one partial structure from the three-dimensional overall structure; and
generating the change in the exposure dose in dependence of the local deviation in the edge portions.

2. The method of claim 1, wherein the three-dimensional overall structure is defined by sequentially defining a plurality of partial structures, wherein the at least one partial structures together approximate the three-dimensional overall structure.

3. The method of claim 1, wherein the exposure dose in an edge portion is increased compared to the remaining part structure.

4. The method of claim 1, wherein the exposure dose in an edge portion is reduced compared to the remaining part structure.

5. The method according to claim 1, wherein a radiation power of the laser writing beam is changed in order to change the exposure dose.

6. The method according to claim 1, wherein for writing the at least one partial structure, a focus region of the laser writing beam is shifted through the lithography material and a speed of the shift of the focus region is changed in order to change the exposure dose.

7. The method according to claim 1, wherein for writing the at least one partial structure, the focus region of the laser writing beam passes through a scan curve through the lithography material with a plurality of immediately adjacent curve portions, wherein a waiting time is waited between passing through two consecutively traversed curve portions, during which waiting time no exposure dose is irradiated.

8. The method according to claim 1, wherein for writing the at least one partial structure, the focus region of the laser writing beam passes through a scan curve through the lithography material with a plurality of immediately adjacent curve portions, wherein the exposure dose in the edge portion of a respective partial structure is changed such that an average distance which the immediately adjacent lying curve portions in the edge portion have from one another is different from the average distance which immediately adjacent lying curve portions have from one another in other portions of the respective partial structure.

9. The method according to claim 1, wherein for writing the at least one partial structure, the focus region of the laser writing beam passes through a scanning curve through the lithography material, and whereby the exposure dose in the edge portion is changed by passing the scan curve within the edge portion several times.

10. The method according to claim 1, wherein the at least one partial structure is composed of a set of volume elements, and wherein the laser writing beam is formed as a sequence of laser pulses which are irradiated at a pulse rate, wherein each laser pulse is used to write a volume element, and wherein the exposure dose is changed by varying the pulse rate and/or the pulse length.

11. The method of claim 1, wherein said dependence is given by a function according to which the exposure dose increases monotonically with the local deviation.

12. The method of claim 1, wherein said dependence is given by a function according to which the exposure dose falls monotonously with the local deviation.

13. A method for producing a three-dimensional overall structure by means of laser lithography in a lithography material, said method comprising:
  defining the three-dimensional overall structure in that at least one partial structure is defined, such that said at least one partial structure approximates the three-dimensional overall structure;
  radiating, for purposes of writing the at least one partial structure, an exposure dose into the lithography material in a focal region of a laser writing beam while exploiting multi-photon absorption;
  changing the exposure dose in comparison to a remaining partial structure in the at least one partial structure in edge portions, which directly adjoin an external surface of the three-dimensional overall structure to be produced;
  providing a data set representing the external surface of the whole structure; and
  determining local slopes and/or curvatures of the external surface, the change of the exposure dose being dependent on the local slope and/or curvature of the region of the external surface which adjoins the edge portion of the at least one partial structure.

14. A non-transitory computer readable medium having instructions stored thereon, such that when the instructions are read and executed by one or more processors, said one or more processors is configured to perform the method of claim 1.

15. The method of claim 2, wherein the exposure dose in an edge portion is increased compared to the remaining part structure.

16. The method of claim 2, wherein the exposure dose in an edge portion is reduced compared to the remaining part structure.

17. The method according to claim 2, wherein a radiation power of the laser writing beam is changed in order to change the exposure dose.

18. The method according to claim 3, wherein a radiation power of the laser writing beam is changed in order to change the exposure dose.

19. The method according to claim 4, wherein a radiation power of the laser writing beam is changed in order to change the exposure dose.

20. A non-transitory computer readable medium having instructions stored thereon, such that when the instructions are read and executed by one or more processors, said one or more processors is configured to perform the method of claim 13.

* * * * *